US008326589B2

(12) United States Patent
Chiang et al.

(10) Patent No.: US 8,326,589 B2
(45) Date of Patent: Dec. 4, 2012

(54) STABLE EQUILIBRIUM POINT (SEP) CALCULATION APPARATUS OF POWER SYSTEM

(75) Inventors: Hsiao-Dong Chiang, Ithaca, NY (US); Hua Li, Ithaca, NY (US); Yasuyuki Tada, Tokyo (JP); Ryuya Tanabe, Tokyo (JP)

(73) Assignees: The Tokyo Electric Power Company, Incorporated, Tokyo (JP); BIGWOOD SYSTEMS, Incorporated, Ithaca, NY (US)

( * ) Notice: Subject to any disclaimer, the term of this patent is extended or adjusted under 35 U.S.C. 154(b) by 149 days.

(21) Appl. No.: 12/850,051

(22) Filed: Aug. 4, 2010

(65) Prior Publication Data

US 2010/0324872 A1    Dec. 23, 2010

Related U.S. Application Data

(63) Continuation of application No. PCT/US2008/058228, filed on Mar. 26, 2008.

(51) Int. Cl.
*G06F 7/60* (2006.01)
*G06F 7/48* (2006.01)
*G06F 17/50* (2006.01)
*G06G 7/62* (2006.01)
*G06G 7/54* (2006.01)
*G05D 3/12* (2006.01)
*G05D 5/00* (2006.01)
*G05D 9/00* (2006.01)

(52) U.S. Cl. ......... 703/7; 703/2; 703/3; 703/13; 703/18; 700/286; 700/292; 700/293; 700/295

(58) Field of Classification Search .................. 703/7, 2, 703/3, 13, 18; 700/286, 292, 293, 295
See application file for complete search history.

(56) References Cited

U.S. PATENT DOCUMENTS

| 5,483,462 | A | * | 1/1996 | Chiang | 700/293 |
| 5,566,085 | A | * | 10/1996 | Marceau et al. | 700/293 |
| 5,594,659 | A | * | 1/1997 | Schlueter | 700/286 |
| 5,610,834 | A | * | 3/1997 | Schlueter | 700/293 |
| 5,642,000 | A | * | 6/1997 | Jean-Jumeau et al. | 307/31 |
| 5,719,787 | A | * | 2/1998 | Chiang et al. | 700/293 |
| 5,745,368 | A | * | 4/1998 | Ejebe et al. | 702/164 |
| 5,796,628 | A | * | 8/1998 | Chiang et al. | 700/295 |

(Continued)

OTHER PUBLICATIONS

Jin et al. "An Application of Reachable Set Analysis in Power System Transient Stability Assessment", 2005.*

(Continued)

*Primary Examiner* — Shambhavi Patel
(74) *Attorney, Agent, or Firm* — Oblon, Spivak, McClelland, Maier & Neustadt, L.L.P.

(57) ABSTRACT

In the present invention, in a case where a stable equilibrium point calculation is not calculable by using a Newton method, a damping factor of a mechanical system differential equation of a generator is set to be greater than an actual value of the generator of the power system. By applying pseudo-transient simulation to the nonlinear differential algebraic equation of the power system including the mechanical system differential equation of the generator, in which the damping factor is set, a norm of a mechanical system equation is found. If the found norm meets a predetermined condition, variable values of the power system at a time when the norm is found are set as initial values of the nonlinear differential algebraic equation of the power system. A stable equilibrium point is determined by applying the Newton method to the nonlinear differential algebraic equation in which the initial values are set.

6 Claims, 5 Drawing Sheets

U.S. PATENT DOCUMENTS

| | | | | |
|---|---|---|---|---|
| 6,219,591 | B1 * | 4/2001 | Vu et al. | 700/286 |
| 6,249,719 | B1 * | 6/2001 | Vu et al. | 700/292 |
| 6,313,752 | B1 * | 11/2001 | Corrigan et al. | 340/657 |
| 6,496,757 | B1 * | 12/2002 | Flueck et al. | 700/292 |
| 6,597,999 | B1 * | 7/2003 | Sinha et al. | 702/64 |
| 6,868,311 | B2 * | 3/2005 | Chiang et al. | 700/293 |
| 6,917,888 | B2 * | 7/2005 | Logvinov et al. | 702/59 |
| 7,096,175 | B2 * | 8/2006 | Rehtanz et al. | 703/18 |
| 7,277,832 | B2 * | 10/2007 | Chiang | 703/2 |
| 7,483,826 | B2 * | 1/2009 | Chiang et al. | 703/18 |
| 7,603,203 | B2 * | 10/2009 | Zhang et al. | 700/295 |
| 7,761,402 | B2 * | 7/2010 | Chiang et al. | 706/62 |
| 8,095,326 | B2 * | 1/2012 | Berggren et al. | 702/58 |
| 2006/0047370 | A1 * | 3/2006 | Chu et al. | 700/292 |
| 2006/0190227 | A1 * | 8/2006 | Chiang et al. | 703/13 |

OTHER PUBLICATIONS

Paganini et al. "Generic Properties, One-Parameter Deformations, and the BCU Method", IEEE Transactions on Circuits and Systems—I: Fundamental Theory and Applications, vol. 46, No. 6, Jun. 1999.*

Shen et al. "A New Transient Stability Index of Power Systems Based on Theory of Stability Region and Its Applications", IEEE 2006.*

Knazins et al. "Stability of Power Systems with Large Amounts of Distributed Generation", 2004.*

Xue et al. "Power system transient stability assessment based on quadratic approximation of stability region", Electric Power Systems Research 76 (2006) 709-715.*

Cheng et al. "Quadratic form of stable sub-manifold for power systems", Int. J. Robust Nonlinear Control 2004; 14:773-788.*

Jin et al. "Power System Transient Stability Design using Reachability based Stability-Region Computation", IEEE 2005.*

Ghandardi, Merdhad. "Control Lyapunov Functions: A Control Strategy for Damping of Power Oscillations in Large Power Systems", 2004.*

Chiang et al. "Stability Regions of Nonlinear Autonomous Dynamical Systems", IEEE Transactions on Automatic Control, vol. 33, No. 1, Jan. 1988.*

Chu et al. "Direct Stability Analysis of Electric Power Systems Using Energy Functions: Theory, Applications, and Perspective", Proceedings of the IEEE, vol. 83, No. 11, Nov. 1995.*

Ma et al. "Calculation of Stability Region", IEEE 2003.*

Robert C. Melville, et al., "Artificial Parameter Homotopy Methods for the DC Operating Point Problem," IEEE Transactions on Computer-Aided Design of INtergrated Circuits and Sysetms, vol. 12, No. 6, p. 861-877, Jun. 1993.

Thomas L. Quarles, "SPICE 3C.1 User's Guide." Berkeley: Univeristy California, EECS Industrial Liason Program, Apr. 1989, pp. 1-80.

Todd S. Coffey, et al., "Pseudo-Transient Continuation and Differential-Algebraic Equations," Submitted for Publication, 2002, Society for Industrial and Applied Mathematics Journal of Scientific Computing, vol. 25, No. 2, pp. 553-569.

C.T. Kelley, et al., "Convergence Analysis of Pseudo-Transient Continuation," Society for Industrial and Applied Mathematics, vol. 35, No. 2, pp. 508-523, Apr. 1998.

Hsiao-Dong Chiang, et al., "Foundations of Direct Methods for Power System Transient Stability Analysis," IEEE Transactions on Circuits and Systems, vol. 34, No. 2, Feb. 1987, pp. 160-173.

Hsiao-Dong Chiang, et al., "Stability of Nonlinear Systems Described by a Second-Order Vector Differential Equation," IEEE Transactions on Circuits and Systems, vol. 35, No. 6, Jun. 1988, pp. 703-711.

* cited by examiner

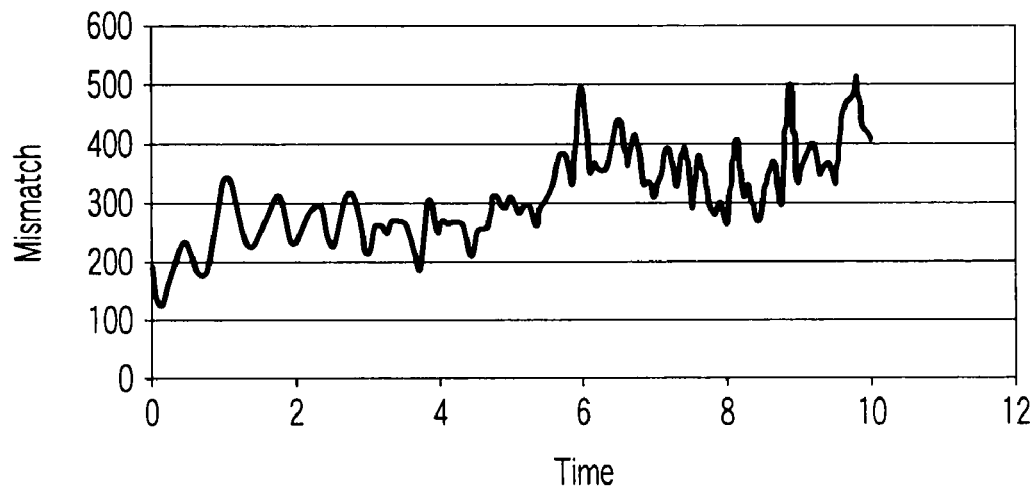
F I G. 5
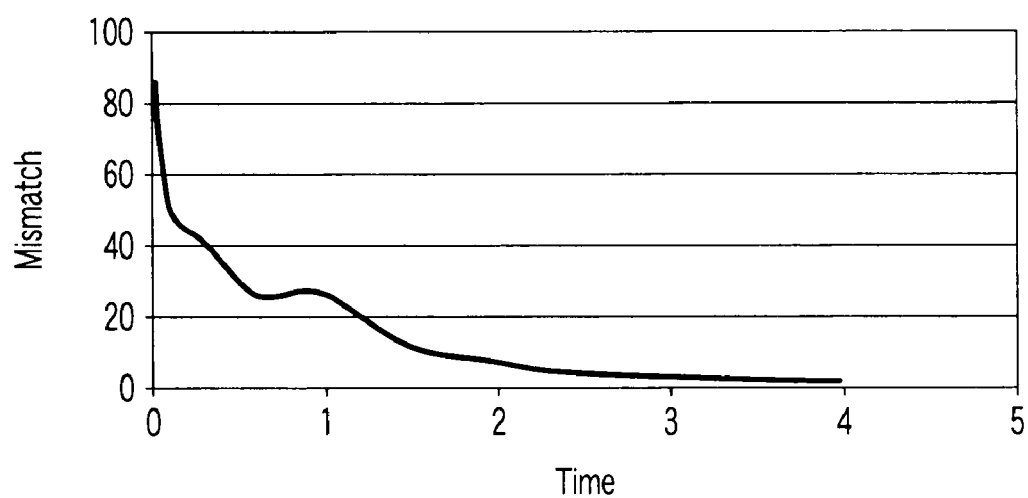
F I G. 6

STABLE EQUILIBRIUM POINT (SEP) CALCULATION APPARATUS OF POWER SYSTEM

CROSS-REFERENCE TO RELATED APPLICATIONS

This is a Continuation Application of PCT Application No. PCT/US2008/058228, filed Mar. 26, 2008, which was published under PCT Article 21(2) in English.

BACKGROUND OF THE INVENTION

1. Field of the Invention

The present invention relates to a stable equilibrium point calculation apparatus which calculates a stable equilibrium point of a system, and more particular to a BCU classifier (Boundary of stability-region-based Controlling Unstable equilibrium point classifier) system which can classify contingencies more exactly and quickly than a conventional BCU classifier system.

2. Description of the Related Art

A stable equilibrium point of a nonlinear dynamic system is obtained by solving a multidimensional nonlinear equation. Thus, usually, a Newton method, which makes use of a well-known Jacobian matrix, is well known.

Since the Newton method performs a convergence calculation by the Jacobian matrix, there are some cases in which convergence is not attained. In order to solve this problem of non-convergence, various methods have been proposed (reference documents 1 and 2). These proposed methods include a pseudo-transient simulation method (reference documents 3 and 4).

Reference document 1: S.-C. Fang, R. C. Melville, L. Trajkovic, and L. T. Watson, "Artificial parameter homotopy methods for the dc operating point problem," IEEE Trans. Comput.-Aided Des. Integr. Circuits syst., vol. 12, No. 6, pp. 861-877, June 1993.

Reference document 2: T. L. Quarles, SPICE 3C.1 User's Guide. Berkeley: Univ. California, EECS Industrial Liaison Program, April 1989.

Reference document 3: T. S. Coffey, C. T. Kelley, and D. E. Keyes, "Pseudo transient continuation and differential algebraic equations," SIAM J. Sci. Comput., vol. 25, No. 2, pp. 553-569.

Reference document 4: C. T. Kelley and D. E. Keyes, "Convergence analysis of pseudo-transient continuation," SIAM J. Numer. Anal., vol. 35, No. 2, pp. 508-523, 1998.

To find a stable equilibrium point (SEP) of a nonlinear dynamic system is important in order to confirm the stable operation of the system. In order to find the stable equilibrium point, a nonlinear simultaneous equation is solved. As regards a nonlinear simultaneous equation, it is difficult to analytically obtain a solution, so that a Newton method is generally used. In the Newton method, a Jacobian matrix is utilized and linear simultaneous equations are repeatedly solved, and thereby a solution is found. Since this method is simple, the method is used in a wide field.

In a transient stability screening program (BCU method), too, a stable equilibrium point is calculated by a Newton method since it is important to analyze the property of the stable equilibrium point. In a case where a stable equilibrium point cannot be found, there is no choice but to determine that the system is very unstable, and a detailed-time-domain simulation which involves a great amount of computation has to be performed. Thus, a great deal of labor is needed in order to determine contingencies which are classified by the stable equilibrium point convergence problem of the BCU classification method.

Although the Newton method is an easy-to-handle, highly practical method, numerical divergence occurs if initial values are not proper (i.e. if initial points are not present in a region where convergence is possible). No index is given for determining whether convergence is not attained due to numerical divergence, or there is, actually, no stable equilibrium point. If there is no stable equilibrium point, the danger of system collapse is considerably high and a proper measure is needed. In a case where it is unclear whether a stable equilibrium point is actually present or not, an appropriate calculation procedure for evaluating a stability of the power system can not be executed.

A problem in a case where a stable equilibrium point cannot be found by the Newton method may become a fatal defect, in particular, in a case where transient stability evaluation needs to be carried out on line, as in the case of BCU method.

A nonlinear simultaneous equation is a static calculation equation, and inherently it does not have dynamic characteristics. However, there is known a method (Pseudo-Transient Method) in which virtual dynamic characteristics are assumed in the nonlinear simultaneous equation, and dynamic simulation (an implicit integration method with a variable integral time step is used) is performed, thereby obtaining approximation of a stable equilibrium point. Since the pseudo-transient method is based on a simulation method, it is hardly possible to completely attain convergence to a stable equilibrium point. Thus, if the integral time step increases to a certain degree, it is assumed that the vicinity of a stable equilibrium point is reached, and a convergence point is found by the Newton method (FIG. 1). In a case where there is no stable equilibrium point, some features, for instance, such a feature that the integral time step does not increase, would appear. Accordingly, distinction becomes clear between a problem relating to numerical analysis and a case in which there is, actually, no stable equilibrium point.

In many cases, the pseudo-transient simulation method effectively exhibits desired effects. However, while the pseudo-transient simulation method was being applied to the stable equilibrium point calculation of a classifier II of an improved BCU classification method (reference document 5) of a TEPCO-BCU method, it was made clear that if the attenuation of the system is not large, many integral calculations are required in order to calculate a stable equilibrium point, and that if vibration properties are high, a stable equilibrium point cannot properly be found.

Reference document 5: U.S. Pat. No. 6,868,311.

BRIEF SUMMARY OF THE INVENTION

The object of the present invention is to improve a pseudo-transient simulation method, to improve the reliability and calculation speed of a stable equilibrium point calculation, and to enhance the performance of an improved BCU classification method.

In order to achieve this object, the following two techniques have been invented:

1) If the damping of a motion equation is increased, convergence to an equilibrium point becomes stable and quick.

2) Even if the damping of a motion equation of an electric generator is increased in a pseudo-manner, a SEP is unchanged.

By developing a logic for calculating a stable equilibrium point with use of these two techniques, the object can be achieved at high level.

According to a first aspect of the present invention, there is provided a stable equilibrium point calculation apparatus of a power system, comprising: means for applying a pseudo-transient simulation method to a nonlinear differential algebraic equation of the power system including a mechanical system differential equation of a generator of the power system, in which a mechanical system damping factor of the generator in the power system is set to be greater, by a predetermined degree, than an actual mechanical system damping factor of the generator, thereby finding a norm of a mechanical system equation of the nonlinear differential algebraic equation of the power system including the mechanical system differential equation of the generator in which the mechanical system damping factor is set, wherein contingencies, on which an influence of virtual power system disturbances is reflected, is reflected as parameters of variables in the nonlinear differential algebraic equation of the power system; means for determining whether the found norm meets a predetermined condition; means for setting, when it is determined that the norm meets the predetermined condition, variable values of the nonlinear differential algebraic equation including the mechanical system differential equation of the generator at a time, when the value that is determined to meet the predetermined condition is found, as initial values of the variables of the nonlinear differential algebraic equation of the power system; and means for determining a stable equilibrium point (SEP) by applying a Newton method to the nonlinear differential algebraic equation of the power system, in which the initial values are set.

BRIEF DESCRIPTION OF THE SEVERAL VIEWS OF THE DRAWING

FIG. 5 is a view showing an example in which pseudo-transient simulation is simply applied to a nonlinear differential algebraic equation of a power system; and FIG. 6 is a view showing an example in which pseudo-transient simulation is applied to a nonlinear differential algebraic equation of a power system in a case where a damping factor D is set at a large value.

DETAILED DESCRIPTION OF THE INVENTION

A BCU classifier system according to an embodiment of the present invention will now be described with reference to the accompanying drawings.

The BCU classier system has a function of screening out unstable contingencies from contingencies on which the influence of disturbances of a virtual power system (electric power system) is reflected.

Figure 1:
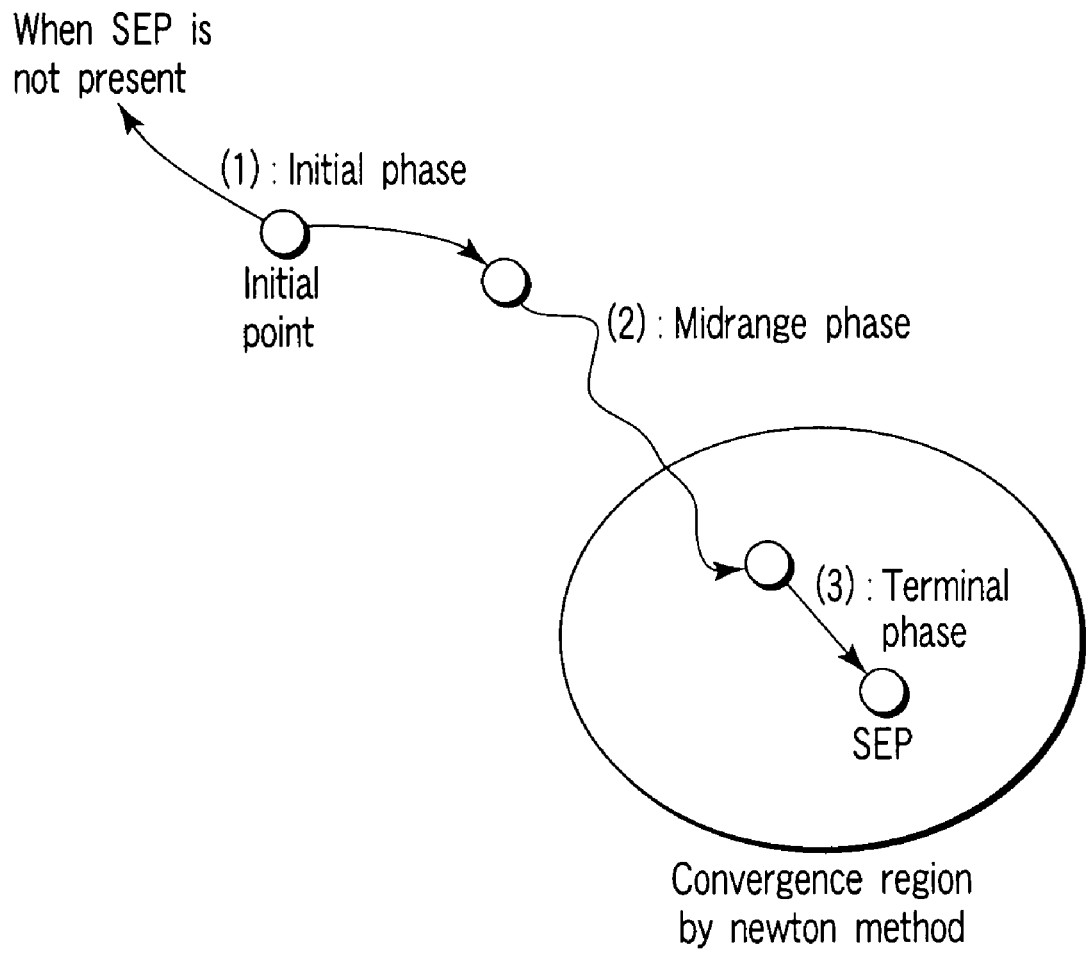
FIG. 1 is a view illustrating the concept of a pseudo-transient simulation method.
Figure 2:
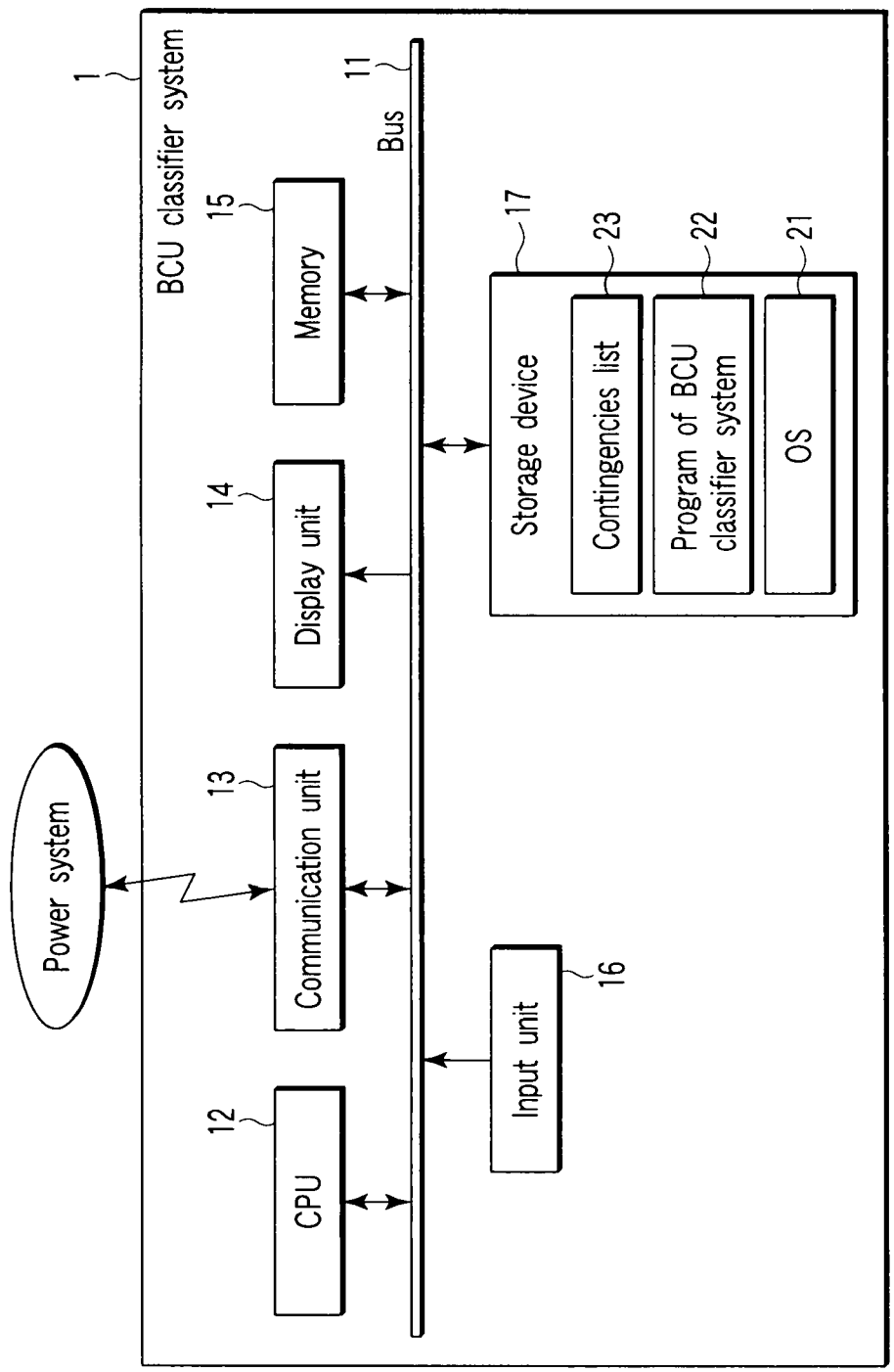
FIG. 2 is a view showing a hardware configuration of a BCU classifier system according to an embodiment of the present invention.

FIG. 2 is a view showing a hardware configuration of the BCU classifier system according to the embodiment of the present invention.

As shown in the Figure, in the BCU classifier system 1, a CPU 12, a communication unit 13, a display unit 14, a memory 15, an input unit 16 and a storage device 17 are connected to a bus 11.

The CPU 12 cooperates with a BCU classifier system program 22 that is stored in the storage device 17, and executes a contingencies screening-out process according to the embodiment of the invention, and executes an overall control of the BCU classifier system 1.

The communication unit 13 receives data, on which disturbances are reflected, from the power system. The received data becomes a basis of contingencies data, where necessary.

The display unit 14 displays, for instance, a result relating to a contingencies screening-out process by the BCU classifier system program 22. The display unit 14 is a display device such as a liquid crystal display or a plasma display.

The memory 15 is used, for example, as a work area which is needed when the BCU classifier system program 22 is executed.

The input unit 16 is an interface for enabling a user to input data of, e.g. contingencies, and is, for example, a keyboard or a touch panel.

The storage device 17 is, for instance, a hard disk drive (HDD) for storing programs and data which are necessary for the contingencies screening-out process. The storage device 17 stores an OS (Operating System) 21, BCU classifier system program 22 and a contingencies list 23.

The BCU classifier system program 22 is an application program which runs on the OS 21, and cooperates with the CPU 12 to execute the contingencies screening-out process according to the embodiment of the present invention.

The contingencies list 23 stores various contingencies data which are objects of screening in the contingencies screening-out process relating to the embodiment of the invention. The contingencies data is reflected, as parameters, on variables of a nonlinear differential algebraic equation which represents the power system.

In the case of performing simulation for discriminating a stable equilibrium point, it is unrealistic to discriminate the stability of the power system by actually causing a fault. Thus, contingencies data, which is set by the user in advance, is used.

Specifically, the contingencies data is virtual data which is representative of a state of the power system which occurs when a certain fault takes place in the power system. The contingencies data itself, which is the object of screening in the BCU classifier, is publicly known, and a detailed description thereof is omitted here.

Figure 3:
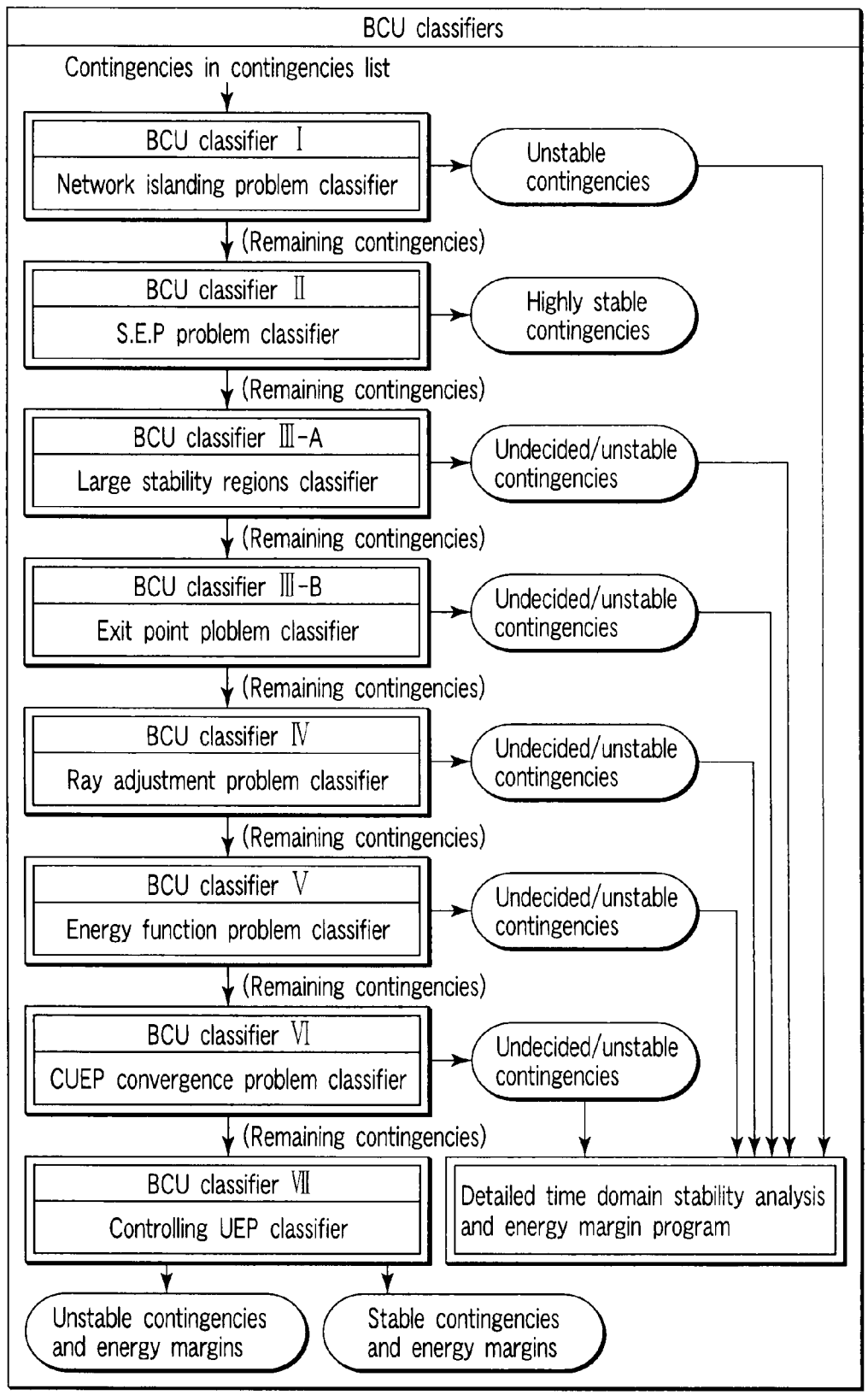
FIG. 3 is a functional block diagram of the BCU classifier system.

FIG. 3 is a functional block diagram of the BCU classifier system according to the embodiment of the invention. In FIG. 3, the functions, other than a BCU classifier II, are the functions disclosed in reference document 5 and are publicly known techniques.

The respective structural elements are described in brief.

A BCU classifier I (for a network islanding problem) is so designed as to screen out highly unstable contingencies which consequently cause a network islanding problem, with respect to successively input contingencies, which are included in the contingencies stored in the contingencies list.

A BCU classifier II (for a stable equilibrium point convergence problem) is so designed as to detect potentially unstable contingencies which cause the following stable equilibrium point convergence problems, in the case of calculating post-contingencies stable equilibrium points, beginning with pre-contingencies stable equilibrium points, by applying a numerical method to the remaining contingencies which have not been screened out by the BCU classifier I.

(i) (numerical divergence problem) A divergence problem exists when a post-fault stable equilibrium point is calculated from the beginning with a pre-contingencies stable equilibrium point, or (ii) (inaccurate convergence problem) Convergence occurs to an erroneous post-fault EP (equilibrium point).

A method of determining a stable equilibrium point of the BCU classifier II according to the embodiment of the invention will be described later.

A BCU classifier III-A (classifier for a high stability region) is so designed as to screen out highly stable contingencies, which bring about, as a result, a stability region with a large (enough size) post-fault stable equilibrium point that forms a basis, with respect to the remaining contingencies which have not been screened out by the BCU classifier II.

This classifier makes use of partial dynamic information in an exit point search process of the BCU method. The following indices are designed for this classifier:

$T_{exit}$: a time that is needed to reach an exit point of a trajectory at a time of fault.

$\delta_{smax}$: a maximum angular difference between a pre-fault stable equilibrium point and a calculated post-fault EP.

A BCU classifier III-B (classifier for an exit point problem) is so designed as to screen out potentially unstable contingencies, which result in a so-called exit point problem, with respect to the remaining contingencies which have not been screened out by the BCU classifier III-A. This classifier makes use of certain dynamic information while searching for an exit point. The following two indices are designed for this classifier:

$T_{exit}$: a time that is needed to reach an exit point of a trajectory at a time of fault.

A potential energy difference between a pre-fault stable equilibrium point and an exit point.

In consideration of study contingencies, if an exit point problem occurs, that is, if an exit point can be found in a time interval [0, $T_{exit}$], or if a potential energy difference is negative, contingencies are classified as being potentially unstable.

A BCU classifier IV (classifier for a ray adjustment problem) is so designed as to screen out potentially unstable contingencies on the basis of certain dynamic information during a search of a minimum gradient point, with respect to the remaining contingencies which have not been screened out by the BCU classifier III-B.

If ray adjustment fails during a search of a minimum gradient point, the heuristic that a maximum point along a ray is present on a boundary of stability of a reduced-state system in the BCU method does not apply, and this indicates that search contingencies are potentially unstable. We propose the following index for this classifier:

N (ray adjustment): the total number of faults in a process of ray adjustment.

In consideration of study contingencies, if the numerical value N (ray adjustment) is greater than a threshold, contingencies are regarded as having a ray adjustment problem, and are classified as being unstable.

A classifier V (classifier for an energy function problem).

In an energy function, a transmission conductance of an electric power system is sufficiently small, and this function is derived on the basis of the supposition that three conditions that are necessary for the energy function are satisfied. If the transmission conductance is not sufficiently small, it is impossible to directly evaluate the transient stability by using a (numerical value) energy function.

In this classifier, we design an index by using characteristics that the energy function decreases along the system trajectory. In the BCU classifier V, with respect to the remaining contingencies which have not been screened out by the BCU classifier IV, if the potential energy at a minimum gradient point is higher than that at the exit point, the corresponding contingencies are discriminated as contingencies which cause an energy function problem and are classified as being potentially unstable.

A BCU classifier VI (for an unstable equilibrium point convergence problem) is so designed as to detect a subsequent unstable equilibrium point convergence problem, in the case of calculating a controlling unstable equilibrium point, beginning with a minimum gradient point, by applying a numerical method to the remaining contingencies which have not been screened out by the BCU classifier V.

(i) (numerical convergence problem) A divergence problem exists when a controlling unstable equilibrium point (CUEP) is calculated from the beginning with a minimum gradient point, or (ii) (inaccurate convergence problem) Convergence occurs to an erroneous controlling unstable equilibrium point (in other words, a minimum gradient point is present, not in a convergence region of a controlling unstable equilibrium point, but in a convergence region of another unstable equilibrium point).

In this classifier, the following two indices are designed to identify contingencies which cause an unstable equilibrium point convergence problem. A study contingency having an unstable equilibrium point contingency problem is classified as being potentially unstable.

$I_{smax}$: a maximum number of iterations in calculation of a central unstable equilibrium point.

$\delta_{smax}$: a maximum angular difference between a minimum gradient point and a calculated unstable equilibrium point.

A BCU classifier VII (classifier for a controlling unstable equilibrium point) uses an energy value at a controlling unstable equilibrium point as critical energy with respect to the remaining contingencies which have not been screened out by the BCU classifier VI, and classifies each of the remaining contingencies as (definitely) stable ones or (potentially) unstable ones. According to the theory of the controlling unstable equilibrium point method, if the energy value at a time when a fault is remedied is less than a critical energy value, the corresponding contingencies is (definitely) stable, and is, otherwise, (potentially) unstable.

The contingencies, which are screened out by the BCU classifier II to BCU classifier VI, are analyzed by a BCU-guided time domain method. The BCU-guided time domain method is a publicly known technique (see reference document 5), and the input and output are as follows:

Input: A power system having related data on dynamic reliability evaluation, and contingencies.

Output: Stability evaluation of contingencies on a power system, and an energy margin value.

Figure 4:
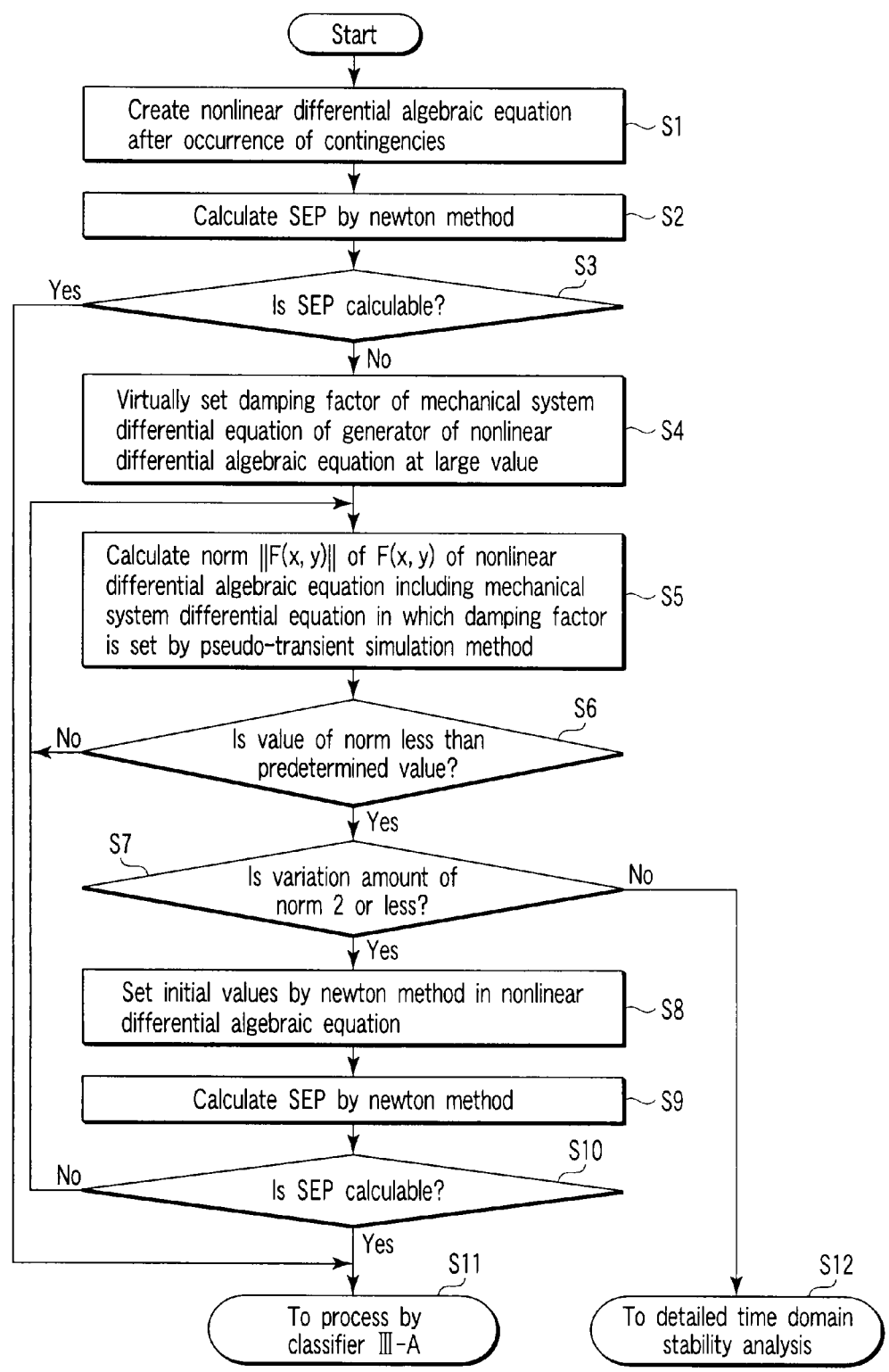
FIG. 4 is a flow chart for explaining a determination method of a stable equilibrium point in a BCU classifier II according to the embodiment of the invention.

Next, referring to a flow chart of FIG. 4, a description is given of a determination method of a stable equilibrium point in the BCU classifier II according to the embodiment of the present invention.

In order to find a stable equilibrium point, a stationary state of a nonlinear differential equation, $$\dot{x}=F(x)$$

is solved, that is, a nonlinear simultaneous equation of, $$0=F(x),$$

is solved. In the case of a power system, if the form of a nonlinear differential equation is adopted, the matrix becomes a dense matrix, which is not preferable from the viewpoint of reduction in computation load. Thus, the equation is expressed in the form of a nonlinear differential algebraic equation (DAE form).

To start with, if contingencies are input, a nonlinear differential algebraic equation (DAE form) of a power system is created (S1). The nonlinear differential algebraic equation is expressed by the following equation (1):

$$\begin{cases} \dot{x} = F(x, y) \\ G(x, y) = 0 \end{cases} \quad (1)$$

where
  F(x, y): a mechanical system equation of the power system,
  G (x, y): a power flow equation of the power system, and
  x, y: variables of the nonlinear differential algebraic equation of power system.

In the contingencies, the influence of disturbances of a virtual power system is reflected, and the contingencies are reflected, as parameters, on the variables of the nonlinear differential algebraic equation of power system.

Subsequently, using a Newton method, a stable equilibrium point is calculated from the nonlinear differential algebraic equation (equation (1)) of the power system which is generated in S1 (S2), and it is determined whether the stable equilibrium point is calculable or not (S3).

It is well known that a nonlinear simultaneous equation is convergence-calculated by a Newton method which makes use of a Jacobian matrix, and it is also used in the BCU method. However, divergence may occur in the Newton method, if a distance between an initial value and a solution is large. Divergence occurs in either of a case in which a solution fails to be found, and a case in which a solution does not exist. In the case where there is no solution, the system is in an extremely unstable state, and additional evaluation is necessary, leading to an enormous amount of computations. In many cases, it is rare that a solution does not actually exist, and usually a solution fails to be found. Thus, there is an effect in improving the convergence performance.

If it is determined in S3 that a stable equilibrium point can be calculated, the contingencies that are input to the classifier II are subjected to a screening-out process by the classifier III-A.

Next, a description is given of a case in which a stable equilibrium point has failed to be found by the Newton method.

If pseudo-transient simulation is simply applied to the nonlinear differential algebraic equation of the power system, the oscillation mode of power fluctuation in the power system is adversely affected, and a proper initial value of the Newton method cannot be obtained. FIG. 5 is a view showing an example in which pseudo-transient simulation is simply applied to the nonlinear differential algebraic equation of the power system. As shown in FIG. 5, it is understood that even if the simulation is performed for 10 seconds, mismatch (=norm) indicating a distance between a current position and a solution does not decrease.

Thus, the damping factor of all generators, which are present in the system, is increased. The mechanical system differential equation of an i-th generator is given by:

$$\frac{2H_i}{\omega_0} \frac{d^2 \delta_i}{dt^2} + \frac{D_i}{\omega_0} \frac{d\delta_i}{dt} = T_{mi} - T_{ei}$$

where
  H: per unit inertia constant of the generator,
  δ: internal angle of the generator,
  ω0: rated angular velocity of the system,
  D: damping factor,
  Tm: mechanical input torque, and
  Te: electrical torque.

In all generators, the value of D is virtually increased from 1 to about 10 times the rated angular velocity. Thereby, the influence of the power fluctuation mode can be decreased. If this influence is eliminated, the power fluctuation cannot be reproduced. However, it is possible to quickly find an excellent initial value for use in the Newton method, which is the very object of the pseudo-transient simulation method.

FIG. 6 is a view showing an example in which pseudo-transient simulation is applied to the nonlinear differential algebraic equation of the power system in a case where the damping factor D is set at a large value. In FIG. 6, the virtually introduced value of D is 500, and ω0 is 120π.

Reference documents 6 and 7 disclose that even if the damping factor is increased, the location of SEP is not influenced.

Reference document 6: H. D. Chiang, F. F. Wu, P. P. Varaiya, "Foundation of direct methods for power system transient stability analysis", IEEE TRANSACTIONS ON CIRCUITS AND SYSTEMS, VOL. 34, No. 2, February 1987.

Reference document 7: H. D. Chiang, F. F. Wu, "Stability of Nonlinear Systems Described by a Second-Order Vector Differential Equation", IEEE TRANSACTIONS ON CIRCUITS AND SYSTEMS, VOL. 35, No. 6, JUNE 1988.

Specifically, in S3, if it is determined that the stable equilibrium point is not calculable, the damping factor of the mechanical system differential equation of all generators, which are present in the power system of the nonlinear differential algebraic equation of the power system, is set to be greater than the value of the actual power system (S4).

The mechanical system differential equation of an i-th generator is given by:

$$\frac{2H_i}{\omega_0} \frac{d^2 \delta_i}{dt^2} + \frac{D_i}{\omega_0} \frac{d\delta_i}{dt} = T_{mi} - T_{ei} \quad (2)$$

where
  H: per unit inertia constant of the generator,
  δ: internal angle of the generator,
  ω0: rated angular velocity of the system,
  D: damping factor,
  Tm: mechanical input torque, and
  Te: electrical torque.

This mechanical system differential equation of the generator acts on the mechanical system equation of the nonlinear differential algebraic equation (equation (1)) of the power system.

In the present embodiment, in all generators, the value of D is virtually increased from 1 to about 10 times the rated angular velocity.

Subsequently, the pseudo-transient simulation method is applied to the nonlinear differential algebraic equation of the power system, which includes the mechanical system differential equation of all generators in which the damping factor is set in S4, and the norm ||F(x,y)|| of the mechanical system equation F(x, y) of the power system of the nonlinear differential algebraic equation is calculated (S5).

If the calculation of the norm ||F(x,y)|| is not successfully carried out, the value thereof increases and there is a case in which the calculation diverges. In such a case, the calculation is forcibly finished. The threshold for the forcible finish is, e.g. 10 times the normal ||F(x0,y0)||. The ||F(x0,y0)|| is an initial value before the start of the pseudo-transient simulation (the normal that is calculated by substituting the stable equilibrium point before occurrence of a fault).

Subsequently, it is determined whether the norm ‖F(x,y)‖ is a predetermined value or less (S6). The predetermined value is, for example, 20% of the norm of the mechanical system equation of the nonlinear differential algebraic equation of the power system in a sound state prior to occurrence of contingencies. Needless to say, this value is variable, as needed. If it is determined in S6 that the value of the norm is not the predetermined value or less, the control returns to S5 and the norm is calculated once again by the pseudo-transient simulation method.

On the other hand, if it is determined in S6 that the norm ‖F(x,y)‖ is the predetermined value or less, it is determined whether the variation amount of the norm is 2 or less per one repetitive calculation of the pseudo-transient simulation method (S7).

In this case, the variation amount is set at 2 or less. However, the variation amount may be set in the range of 1 to 2.

If it is determined in step S7 that the variation amount of the norm is not 2 or less, the control advances to a publicly known time domain stability analysis (S12).

If it is determined in step S7 that the variation amount of the norm is 2 or less, variable values x and y at the time when the norm is determined to be the predetermined value or less are set as initial values of the variables of the nonlinear differential algebraic equation of the power system (S8).

Next, by applying the Newton method to the nonlinear differential algebraic equation of the power system in which the initial values are set, the calculation of the stable equilibrium point is executed (S9) and it is determined whether the calculation of the stable equilibrium point is possible or not (S10).

If it is determined in S10 that the calculation of the stable equilibrium point is possible, the contingencies are determined to be stable and are sent to the process by the classifier III-A (S11). On the other hand, if it is determined that the calculation of the stable equilibrium point is not possible, the control returns to S5, and the norm is calculated by the pseudo-transient simulation method.

According to the invention of the present embodiment, in a large-scale system of 13,000 bus lines, stable equilibrium points were successfully found in 42 cases of 59 cases in which no stable equilibrium point was found by the Newton method. As regards the cases in which stable equilibrium points could not be found, there is little possibility that numerical calculations could not be carried out, and the reliability of the system was remarkably enhanced.

The above-described embodiment relates to the case in which the determination method of stable equilibrium points of the present embodiment was incorporated in the BCU classifier II. The invention, however, is not limited to this case, and the invention is widely applicable to methods of determining stable equilibrium points of power systems.

Furthermore, the determination method of stable equilibrium points of the present embodiment is not limited to methods of determining stable equilibrium points of power systems, but is applicable to determination of stable equilibrium points of various systems.

The present invention is usable in stable equilibrium point calculation apparatuses which calculate stable equilibrium points of systems.

What is claimed is:

1. A stable equilibrium point calculation apparatus of a power system, comprising:
   means for applying a pseudo-transient simulation method to a nonlinear differential algebraic equation of the power system including a mechanical system differential equation of a generator of the power system, in which a mechanical system damping factor of the generator in the power system is set to be greater, by a predetermined degree, than an actual mechanical system damping factor of the generator, thereby finding a norm ‖F(x,y)‖ of a mechanical system equation of the nonlinear differential algebraic equation of the power system including the mechanical system differential equation of the generator in which the mechanical system damping factor is set, wherein contingencies, on which an influence of virtual power system disturbances is reflected, is reflected as parameters of variables in the nonlinear differential algebraic equation of the power system;
   means for determining whether the found norm meets a predetermined condition;
   means for setting, when it is determined that the norm meets the predetermined condition, variable values of the nonlinear differential algebraic equation including the mechanical system differential equation of the generator at a time, when the norm that is determined to meet the predetermined condition is found, as initial values of the variables of the nonlinear differential algebraic equation of the power system; and
   means for determining a stable equilibrium point (SEP) by applying a Newton method to the nonlinear differential algebraic equation of the power system, in which the initial values are set,
   wherein F(x,y) is the mechanical system equation of the power system, and
   x,y are variables of the nonlinear differential algebraic equation of the power system.

2. The stable equilibrium point calculation apparatus of a power system, according to claim 1, wherein the nonlinear differential algebraic equation of the power system is expressed by the following formula:

$$\begin{cases} \dot{x} = F(x, y) \\ G(x, y) = 0 \end{cases}$$

where
   G (x, y): a power flow equation of the power system.

3. The stable equilibrium point calculation apparatus of a power system, according to claim 1, wherein the mechanical system differential equation of the generator is expressed by the following formula:

$$\frac{2H_i}{\omega_0} \frac{d^2 \delta_i}{dt^2} + \frac{D_i}{\omega_0} \frac{d\delta_i}{dt} = T_{mi} - T_{ei}$$

where
   i: an i-th generator of the power system,
   H: per unit inertia constant of the generator,
   δ: internal angle of the generator,
   ω0: rated angular velocity of the system,
   D: damping factor,
   Tm: mechanical input torque, and
   Te: electrical torque.

4. The stable equilibrium point calculation apparatus of a power system, according to claim 1, wherein the damping factor is set in a range of 1 to 10 times a rated angular velocity of the power system.

5. The stable equilibrium point calculation apparatus of a power system, according to claim 1, wherein the predetermined condition is that the found norm is 20% or less of the mechanical system equation of the nonlinear differential algebraic equation of the power system in a sound state prior to occurrence of contingencies, and that a variation amount of the norm is 2 or less per one repetitive calculation of the pseudo-transient simulation method.

6. The stable equilibrium point calculation apparatus of a power system, according to claim 1, wherein the means for determining the stable equilibrium point comprises means for determining whether the stable equilibrium point of the power system is calculable or not, by applying a Newton method to the nonlinear differential algebraic equation of the power system to determine the stable equilibrium point.

* * * * *